(12) United States Patent
Zhou (10) Patent No.: US 9,651,996 B2
(45) Date of Patent: May 16, 2017

(54) FLEXIBLE SUBSTRATE, DISPLAY DEVICE AND METHOD FOR BONDING ELECTRONIC DEVICES ON FLEXIBLE SUBSTRATE

(71) Applicant: BOE TECHNOLOGY GROUP CO., LTD., Beijing (CN)

(72) Inventor: Weifeng Zhou, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 37 days.

(21) Appl. No.: 14/348,481

(22) PCT Filed: Jul. 15, 2013

(86) PCT No.: PCT/CN2013/079369
§ 371 (c)(1),
(2) Date: Mar. 28, 2014

(87) PCT Pub. No.: WO2014/176828
PCT Pub. Date: Nov. 6, 2014

(65) Prior Publication Data
US 2015/0192961 A1     Jul. 9, 2015

(30) Foreign Application Priority Data

Apr. 28, 2013  (CN) .......................... 2013 1 0157088

(51) Int. Cl.
*G06F 1/16*       (2006.01)
*B32B 37/18*      (2006.01)
(Continued)

(52) U.S. Cl.
CPC ............ *G06F 1/1652* (2013.01); *B32B 37/18* (2013.01); *B32B 38/0012* (2013.01);
(Continued)

(58) Field of Classification Search
None
See application file for complete search history.

(56) References Cited

U.S. PATENT DOCUMENTS 2,127,081 A * 8/1938 Brown .................. G09F 3/0289
40/306
3,257,678 A * 6/1966 Batchelder ............. A43D 3/022
12/142 R
(Continued)

FOREIGN PATENT DOCUMENTS

CN      1553263 A      12/2004
CN      1693941 A      11/2005
(Continued)

OTHER PUBLICATIONS

Martin, 3-D Christmas Tree inside a card frenchiestamps.com, Oct. 2012,    <https://youtu.be/DYMQ3O59Esl?list=PL64F1CE180EC5D7C4>.*

(Continued)

*Primary Examiner* — Jeff Vonch
(74) *Attorney, Agent, or Firm* — Ladas & Parry LLP (57) ABSTRACT

A flexible substrate, a display device and a method for bonding an electronic device onto a flexible substrate are disclosed. The flexible substrate includes a base substrate, the base substrate includes a bonding portion for bonding an electronic device and an auxiliary bonding portion integrally formed with the bonding portion, the auxiliary bonding portion and the bonding portion are disposed back to back, and the bonding portion completely falls into a region where the auxiliary bonding portion is provided in an orthographic projection direction. With an auxiliary bonding portion being disposed beside the bonding portion for bonding the electronic devices such as ICs and FPCs, when bonding the electronic device onto the bonding portion, the auxiliary bonding portion can enhance the strength of the bonding (Continued)

portion and improve the bonding alignment precision and contact property of the electronic device, which further improves the non-defect ratio of the flexible display device and has a lower cost.

10 Claims, 8 Drawing Sheets

(51) Int. Cl.
    *B32B 38/00*     (2006.01)
    *B32B 38/10*     (2006.01)
    *H05K 1/02*     (2006.01)
    *H04M 1/02*     (2006.01)

(52) U.S. Cl.
    CPC .............. *B32B 38/10* (2013.01); *H05K 1/028* (2013.01); *B32B 2457/00* (2013.01); *B32B 2457/20* (2013.01); *G06F 1/1637* (2013.01); *H04M 1/0268* (2013.01); *H05K 2201/055* (2013.01); *H05K 2201/10128* (2013.01); *Y10T 156/10* (2015.01); *Y10T 156/108* (2015.01); *Y10T 156/1026* (2015.01); *Y10T 156/1043* (2015.01); *Y10T 156/1051* (2015.01); *Y10T 428/24174* (2015.01); *Y10T 428/24182* (2015.01); *Y10T 428/24215* (2015.01); *Y10T 428/24264* (2015.01); *Y10T 428/24273* (2015.01); *Y10T 428/24479* (2015.01)

(56) References Cited

U.S. PATENT DOCUMENTS

| | | | | |
|---|---|---|---|---|
| 4,066,851 A * | 1/1978 | White | H01H 1/403 | 200/292 |
| 4,146,661 A * | 3/1979 | Grandel | G03D 15/043 | 156/157 |
| 4,592,572 A * | 6/1986 | Instance | G09F 3/0289 | 281/2 |
| 4,621,442 A * | 11/1986 | Mack | G09F 3/0289 | 283/81 |
| 4,744,591 A * | 5/1988 | Instance | B31D 1/021 | 281/5 |
| 4,815,990 A * | 3/1989 | Ristedt | H01R 12/61 | 29/846 |
| 4,834,660 A * | 5/1989 | Cotti | H01R 12/82 | 361/749 |
| 4,865,352 A * | 9/1989 | Gollon | G09F 3/0288 | 283/79 |
| 4,905,451 A * | 3/1990 | Jaconelli | B65B 11/045 | 493/440 |
| 4,984,683 A * | 1/1991 | Eller | A44C 25/004 | 206/38 |
| 4,998,342 A * | 3/1991 | Bonnell | H05K 3/3415 | 174/260 |
| 5,008,496 A * | 4/1991 | Schmidt | H05K 1/0278 | 174/254 |
| 5,096,226 A * | 3/1992 | Steffen | G09F 3/0288 | 281/5 |
| 5,113,921 A * | 5/1992 | Pool | B65H 35/004 | 156/40 |
| 5,229,916 A * | 7/1993 | Frankeny | H01L 23/4985 | 174/254 |
| 5,234,517 A * | 8/1993 | Pape | A61F 13/58 | 156/192 |
| 5,234,735 A * | 8/1993 | Baker | G09F 3/0289 | 283/101 |
| 5,264,264 A * | 11/1993 | Shibata | A61F 13/58 | 428/120 |
| 5,372,865 A * | 12/1994 | Arakawa | A61F 13/58 | 428/124 |
| 5,591,521 A * | 1/1997 | Arakawa | A61F 13/493 | 428/352 |
| 5,824,380 A * | 10/1998 | Hagen | B32B 3/04 | 383/62 |
| 6,120,867 A * | 9/2000 | Hamerski | A47G 1/175 | 428/121 |
| 6,121,676 A * | 9/2000 | Solberg | H01L 23/5387 | 257/686 |
| 6,121,988 A * | 9/2000 | Uchiyama | G02F 1/13452 | 174/260 |
| 6,208,521 B1 * | 3/2001 | Nakatsuka | H01L 23/5387 | 174/254 |
| 6,261,658 B1 * | 7/2001 | Schmidt | G09F 1/14 | 283/81 |
| 6,444,307 B1 * | 9/2002 | Tuoriniemi | B05B 15/0456 | 118/504 |
| 6,469,377 B1 * | 10/2002 | Kondo | H01L 23/5382 | 257/686 |
| 6,829,851 B2 * | 12/2004 | Oross | G09F 3/0289 | 40/124.06 |
| 6,833,172 B1 * | 12/2004 | Schwartz | G09F 3/04 | 206/411 |
| 6,879,032 B2 * | 4/2005 | Rosenau | G02B 6/4201 | 257/696 |
| 6,956,288 B2 * | 10/2005 | Ueno | G02F 1/13452 | 257/734 |
| 6,986,930 B2 * | 1/2006 | Giles | B32B 3/04 | 215/232 |
| 7,250,205 B1 * | 7/2007 | Suda | B32B 3/04 | 156/213 |
| 7,593,234 B2 * | 9/2009 | Okuda | G02F 1/13452 | 361/749 |
| 7,698,811 B2 * | 4/2010 | Yang | H05K 3/0097 | 29/829 |
| 2001/0036524 A1 * | 11/2001 | Anderson | B32B 7/06 | 428/40.1 |
| 2003/0117543 A1 * | 6/2003 | Chang | G02F 1/13452 | 349/58 |
| 2005/0078459 A1 | 4/2005 | Yeon | | |
| 2005/0123721 A1 * | 6/2005 | Heikaus | B29C 66/4722 | 428/137 |
| 2006/0112543 A1 * | 6/2006 | Ishikawa et al. | | 29/830 |
| 2006/0280914 A1 * | 12/2006 | Jostler | B65H 45/08 | 428/192 |
| 2007/0052905 A1 | 3/2007 | Chen et al. | | |
| 2008/0138633 A1 | 6/2008 | Park et al. | | |
| 2009/0021666 A1 * | 1/2009 | Chen | G02F 1/133305 | 349/58 |
| 2009/0021678 A1 | 1/2009 | Son et al. | | |
| 2009/0032295 A1 | 2/2009 | Okajima et al. | | |
| 2009/0047468 A1 * | 2/2009 | Papadopoulos | B65D 65/38 | 428/121 |
| 2009/0109636 A1 * | 4/2009 | Arnold | H01L 23/4985 | 361/728 |
| 2009/0324882 A1 * | 12/2009 | Anderson | B65H 35/004 | 428/136 |
| 2011/0031628 A1 | 2/2011 | Takada | | |
| 2011/0122337 A1 | 5/2011 | Shimizu et al. | | |
| 2012/0056859 A1 * | 3/2012 | Chen | G09G 3/20 | 345/204 |
| 2013/0249740 A1 * | 9/2013 | Shedletsky | H01Q 1/38 | 343/700 MS |
| 2014/0034366 A1 * | 2/2014 | Otsubo et al. | | 174/254 |
| 2014/0042406 A1 * | 2/2014 | Degner | H01L 27/326 | 257/40 |

FOREIGN PATENT DOCUMENTS

| | | |
|---|---|---|
| CN | 1928675 A | 3/2007 |
| CN | 101236346 A | 8/2008 |
| CN | 101398540 A | 4/2009 |
| CN | 102084410 A | 6/2011 |
| CN | 101351738 B | 2/2012 |
| CN | 10269015 A | 8/2012 |
| CN | 203276737 U * | 11/2013 |

(56) References Cited

FOREIGN PATENT DOCUMENTS

| | | | | |
|---|---|---|---|---|
| DE | 2539018 | A1 | 3/1977 | |
| DE | 3343745 | A * | 6/1985 | |
| DE | 3442803 | A1 * | 6/1986 | ........... H01L 23/145 |
| JP | 02147330 | A * | 6/1990 | |
| JP | 04245226 | A * | 9/1992 | |
| JP | 06013727 | A * | 1/1994 | |
| JP | 09181215 | A * | 7/1997 | |
| JP | 2000077796 | A * | 3/2000 | |
| JP | 2001-210467 | A | 8/2001 | |
| JP | 2001343902 | A * | 12/2001 | |
| JP | 2007-266204 | A | 10/2007 | |
| JP | 2010239109 | A * | 10/2010 | |
| KR | 20050035970 | A | 4/2005 | |
| KR | 20090062078 | A | 6/2009 | |
| WO | WO 9013989 | A1 * | 11/1990 | ............. H05K 1/189 |
| WO | 2011/161857 | A1 | 12/2011 | |
| WO | WO 2012147484 | A1 * | 11/2012 | |

OTHER PUBLICATIONS

International Search Report Appln. No. PCT/CN201/079369; Dated Jan. 23, 2014.
First Chinese Office Action Appln. No. 201310157088.3; Dated Sep. 2, 2014.
Second Chinese Office Action Appln. No. 201310157088.3; Dated Mar. 25, 2015.
Korean Office Action Appln. No. 10-2014-7010719; Dated Apr. 10, 2015.
Extended European Search Report dated Oct. 27, 2016; Appln. No. 13840117.9-1903 /2993660 PCT/CN2013079369.
Korean Notice of Allowance dated Apr. 8, 2016; Appln. No. 10-2014-7010719.
Chinese Patent Certificate issued Sep. 23, 2015; ZL 2013 1 0157088.3.
Korean Examination Opinion dated Oct. 14, 2015; Appln. No. 10-2014-7010719.
International Preliminary Report on Patentability; issued Nov. 3, 2015; PCT/CN2013/079369.

* cited by examiner

FLEXIBLE SUBSTRATE, DISPLAY DEVICE AND METHOD FOR BONDING ELECTRONIC DEVICES ON FLEXIBLE SUBSTRATE

TECHNICAL FIELD

The invention relates to a flexible substrate, a display device and a method for bonding an electronic device onto a flexible substrate.

BACKGROUND

The flat display technologies have developed rapidly over the last decade, with significant improvements in screen size and display quality. The flat panels have achieved performance comparable to conventional CRT displays in various aspects and are gradually replacing the cumbersome CRT displays. Currently, liquid crystal displays (LCDs) and organic light emitting displays (OLEDs) are the mainstream flat panel displays. On the other hand, flexible displays with their bendable property are widely applied in areas requiring a curved display, such as smart cards, electronic papers, smart tags and so on, covering almost all the applications where the conventional display devices are applicable, and gradually becoming a fashion in the field of display technologies.

Figure 1A:
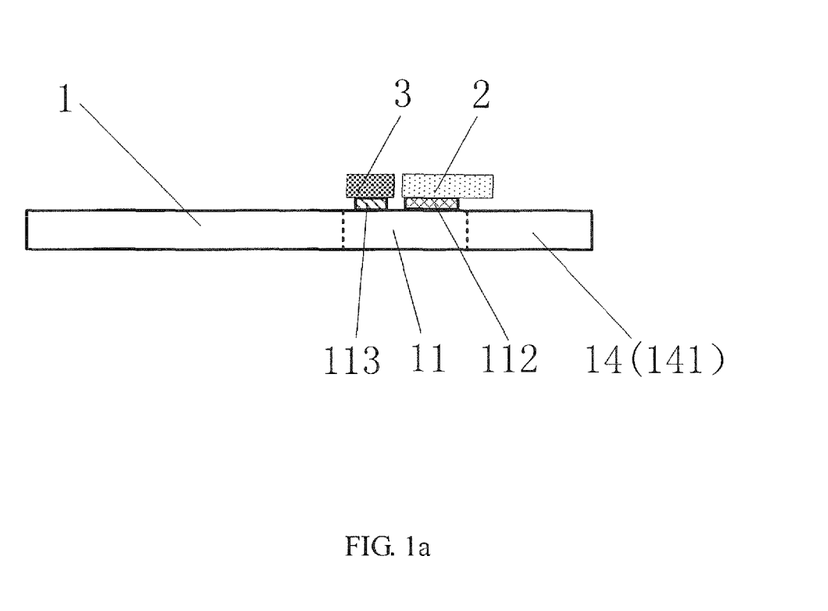
FIG. 1a schematically illustrates a front view of a flexible substrate before bending according to embodiment 1 of the invention, in which an extension portion is disposed at a side of a bonding portion of the flexible substrate.
Figure 1B:
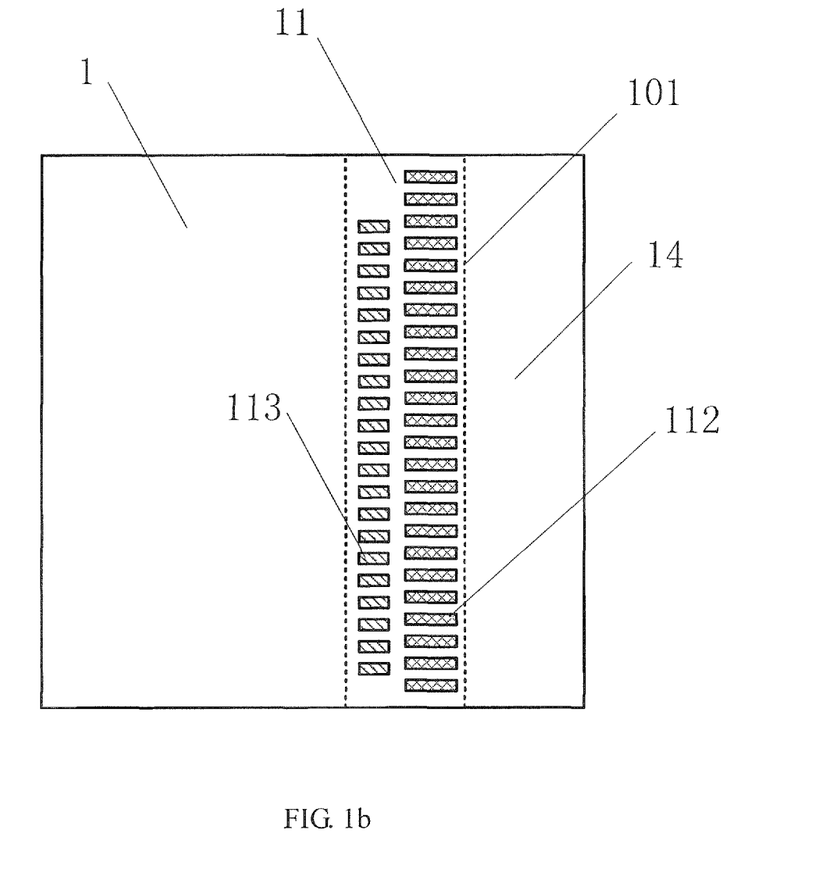
FIG. 1b schematically illustrates a top view of the flexible substrate before bending illustrated in FIG. 1a according to embodiment 1 of the invention.

In a flexible display, as shown in FIG. 1, one important procedure during the fabrication of flexible display devices is to bond an Integrated Circuit (IC, e.g., IC-chip on glass (COG), which is a chip bonded directly on a carrier glass substrate and applicable to LCD and OLED of consumer electronics such as mobile phones, PDAs and other portable devices) or a flexible printed circuit (FPC) to a flexible substrate by using an anisotropic conductive film (ACF). Currently, a flexible substrate normally uses a plastic substrate as the base substrate; because the plastic substrate is generally very thin (with a thickness of 25 to 125 μm) and soft, it can be easily deformed under a large bonding pressure for bonding the IC or FPC to the flexible substrate, thereby affecting the bonding precision and the contact effect of the electronic devices, which may further lead to process issues such as misalignment and poor contact.

Nowadays two solutions are generally used to solve the above problem.

According to the first solution, the plastic substrate of the flexible substrate is first placed on a rigid carrier such as a glass substrate to achieve higher rigidity, which is convenient for bonding; the plastic substrate is then removed from the rigid carrier after the completion of the bonding process. Although the solution can ensure the rigidity of the plastic substrate, higher process stability and clean environment are required upon bonding the IC or PPC onto the plastic substrate, otherwise bonding bubbles may be easily formed at the bonding surface, which will in turn affect the subsequent processes.

The other solution replaces the flexible substrate with a thicker plastic substrate. However, the plastic substrates suitable for flexible substrates of display devices are expensive, remarkably increasing the costs of the flexible displays. Meanwhile, the thicker plastic substrates have the following disadvantages. First, there is big difference between the coefficients of thermal expansion (CTE) of the plastic and glass substrates. Therefore, in the heating process following the bonding process, the different coefficients of thermal expansion between the thicker plastic substrate and the glass substrate and the inherent heat-shrink property of the plastic substrate will cause the glass substrate to warp under the pulling by the plastic substrate, when the heating is finished. Second, a thicker plastic substrates has larger rigidity and can not entirely bond to a glass substrate, which will cause bonding bubbles at the bonding surface. The bubbles will aggregate and expand when heated in the vacuum, affecting the flatness between the two substrates. It therefore shows that the solution of application of thicker plastic substrates for flexible substrates needs to be improved as well.

With the increase in the production volume of flat panels, the competitions in the industry are getting stronger as well. Therefore, in order to increase the competitive power of the product, an urgent technical problem to be solved is to ensure an excellent bonding effect between the electronic device(s) and the flexible substrate such that the product performance can be improved, while reducing the production costs of the flexible displays.

SUMMARY

Embodiments of the invention provide a flexible substrate, a display device and a method for bonding an electronic device onto a flexible substrate. The flexible substrate have low costs and can ensure a good bonding effect when the electronic device are bonded thereon, thereby guaranteeing an excellent display quality of the display device.

An aspect of the invention provides a flexible substrate comprising a base substrate, wherein the base substrate comprises a bonding portion for bonding an electronic device thereon and an auxiliary bonding portion integrally formed with the bonding portion, the auxiliary bonding portion and the bonding portion are disposed back to back, and the bonding portion completely falls into a region where the auxiliary bonding portion is provided in an orthographic projection direction.

As an example, a first bending line is disposed between the bonding portion and the auxiliary bonding portion, the auxiliary bonding portion comprises a first sub-bonding portion, an area of the first sub-bonding portion is larger than or equal to an area of the bonding portion, and the first sub-bonding portion is bended and disposed onto the back side of the bonding portion along the first bending line.

As an example, the auxiliary bonding portion further has a second sub-bonding portion having at least one stacked layer, a second bending line is disposed between the first sub-bonding portion and the second sub-bonding portion, and the second sub-bonding portion is bended and disposed onto the back side of the first sub-bonding portion along the second bending line.

As an example, a groove(s) along the thickness direction of the bonding portion is formed at a position(s) on the base substrate that corresponds to the first bending line and/or the second bending lines, a depth of the groove(s) is less than the thickness of the bonding portion; or a plurality of through holes or blind holes along the thickness direction of the bonding portion are disposed at a position(s) on the base substrate that corresponds to the first bending line and/or the second bending lines.

As an example, a third bending line is disposed between adjacent stacked layers in the second sub-bonding portion, a groove along the thickness direction of the stacked layers in the second sub-bonding portion is disposed at a position on the base substrate that corresponds to the third bending line, a depth of the groove is less than a thickness of a stacked layer in the second sub-bonding portion; or a plurality of through holes or blind holes along the thickness direction of the stacked layers in the second sub-bonding portion is disposed at a position on the base substrate that corresponds to the third bending line.

As an example, the auxiliary bonding portion and the bonding portion are made of a same material.

The auxiliary bonding portion is a removable auxiliary bonding portion.

Another aspect of the invention provides a display device comprising the above-mentioned flexible substrate.

Another aspect of the invention provides a method for bonding an electronic device onto a flexible substrate, comprising a step of bonding the electronic device onto a base substrate of the flexible substrate, and the method further comprises the following step before the step of bonding the electronic device onto the base substrate of the flexible substrate: forming an auxiliary bonding portion disposed back to back with the bonding portion and allowing the bonding portion to completely fall into a region where the auxiliary bonding portion is provided in the orthographic projection direction.

As an example, the step of forming the auxiliary bonding portion disposed back to back with the bonding portion and allowing the bonding portion to completely fall into the region where the auxiliary bonding portion is located in the orthographic projection direction comprises:

extending the base substrate towards an outer side of the bonding portion to dispose an extension portion with an area of the extension portion being larger than or equal to that of the bonding portion; and bending the extension portion towards the back side of the bonding portion such that the extension portion forms the auxiliary bonding portion disposed back to back with the bonding portion.

As an example, a first bending line is disposed between the bonding portion and the extension portion, the extension portion and the bonding portion are made of a same material, the extension portion has a first extension portion with an area of the first extension portion being larger than or equal to that of the bonding portion, and the first extension portion is bended and disposed onto the back side of the bonding portion along the first bending line to form a first sub-bonding portion.

As an example, the method further comprises forming a groove along a thickness direction of the bonding portion at a position on the base substrate that corresponds to the first bending line, a depth of the groove is smaller than the thickness of the bonding portion; or forming a plurality of through holes or blind holes along a thickness direction of the bonding portion at a position on the base substrate that corresponds to the first bending line.

As an example, the method further comprises: the extension portion further comprising a second sub-extension portion, a second bending line is disposed between the first sub-extension portion and the second sub-extension portion, and the second sub-extension portion is bended and disposed onto the back side of the first-extension portion to form a second sub-bonding portion.

As an example, the method further comprises: configuring the second extension portion as having at least one stacked layer, a third bending line is disposed between adjacent stacked layers in the second sub-extension portion, a groove(s) along the thickness direction of the stacked layers in the second sub-bonding portion is disposed at a position(s) of the extension portion that corresponds to the second and/or third bending line, a depth of the groove(s) is less than the thickness of the extension portion; or a plurality of through holes or blind holes along the thickness direction of the stacked layers in the extension portion is disposed at a position of the extension portion that corresponds to the second and/or third bending line.

As an example, the method further comprises removing the auxiliary bonding portion after bonding the electronic device onto the base substrate of the flexible substrate.

In the flexible substrate of the invention, the auxiliary bonding portion is disposed beside the bonding portion for bonding the electronic devices such as ICs or FPCs. When the electronic devices are bonded onto the bonding portion, the auxiliary bonding portion can enhance the strength of the bonding portion and improve the bonding alignment precision and contact property of the electronic device, which further improves the non-defect ratio of the flexible display device and has a lower cost.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Unless otherwise defined, all the technical and scientific terms used herein have the same meanings as commonly understood by one of ordinary skill in the art to which the present invention belongs. The terms "first," "second," and so on which are used in the description and the claims of the present application for invention, are not intended to indicate any sequence, amount or importance, but distinguish various components. Also, the terms such as "a," "an," and the like are not intended to limit the amount, but indicate the existence of at least one. The terms "comprises," "comprising," "includes," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

An embodiment of the invention provides a flexible substrate comprising a base substrate, the base substrate comprises a bonding portion for bonding an electronic device thereon and an auxiliary bonding portion integrally formed with the bonding portion, the auxiliary bonding portion and the bonding portion are disposed back to back, and the bonding portion completely falls into a region where the auxiliary bonding portion is provided in an orthographic projection direction.

An embodiment of the invention provides a display device comprising the above-mentioned flexible substrate.

An embodiment of the invention provides a method for bonding an electronic device onto a flexible substrate, comprising a step of bonding the electronic device onto a base substrate of the flexible substrate, and before the step of bonding the electronic device onto the base substrate of the flexible substrate, the method further comprises the following step of: forming an auxiliary bonding portion disposed back to back with the bonding portion and allowing the bonding portion to completely fall into a region where the auxiliary bonding portion is provided in the orthographic projection direction.

In the invention, the definitions of "front side" and "back side" for the bonding portion, the auxiliary bonding portion, and the stacked layers are respectively as follows: the front side is the side facing the upper side of the paper in the cross-section view of FIG. 2 (left half), or the side in the paper plane in the cross-section view of FIG. 2 (right half); and the back side is the side facing the under side of the paper in the cross-section view of FIG. 2 (left half), or the side in the back side of the paper of FIG. 2 (right half).

Embodiment 1

Figure 2:
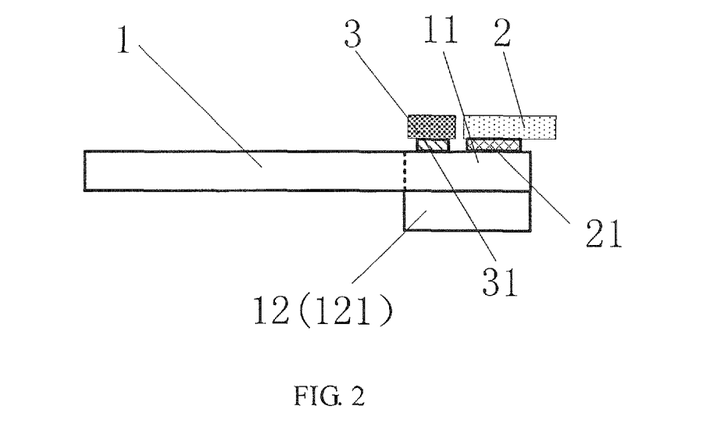
FIG. 2 schematically illustrates a front view of the flexible substrate after bending according to embodiment 1 of the invention, in which the extension portion of FIGS. 1a-1b is bended to the back side of the bonding portion to form an auxiliary bonding portion.

FIG. 2 illustrates a flexible substrate comprising a base substrate 1. The base substrate 1 comprises a bonding portion 11 for bonding an electronic device thereon and an auxiliary bonding portion 12 integrally formed with the bonding portion 11, the auxiliary bonding portion 12 and the bonding portion 11 are disposed back to back, and the bonding portion 11 completely falls into a region where the auxiliary bonding portion is provided 12 in the orthographic projection direction.

Herein, the area of the auxiliary bonding portion 12 is larger than or equal to the area of the bonding portion 11, and the area of the bonding portion 11 is no less than the area covered by the pins of a COG IC and FPC to be bonded.

Preferably, a first bending line is disposed between the bonding portion 11 and the auxiliary bonding portion 12. The auxiliary bonding portion 11 comprises a first sub-bonding portion 121, and the area of the first sub-bonding portion 121 is larger than or equal to the area of the bonding portion 11. The first sub-bonding portion 121 is bended and then disposed on the back side of the bonding portion 11 along the first bending line. In an embodiment of the invention, for example, the first sub-bonding portion 121 may be a layer closely bonded to the back side of the bonding portion 11.

To facilitate the production, the thickness of the first sub-bonding portion 121 is equal to that of the bonding portion 11. Of course, the thickness of the first sub-bonding portion 121 can be designed to be unequal to the thickness of the bonding portion 11 based on practical situations or special requirements.

Herein, the auxiliary bonding portion 12 and the bonding portion 11 are made of a same material. For example, the auxiliary bonding portion 12 may be made of polyimide (PI), poly ethylene naphthalate (PEN), polyethylene terephthalate (PET), fiber-reinforced plastic (FRP), polyether sulfone (PES), polyarylate (PAR) or polycarbonate (PC). Of course, the material and process parameters used by the auxiliary bonding portion 12 may be adjusted according to the requirements of a production line to match the devices under production.

The auxiliary bonding portion 12 may also be removed as required. For example, the auxiliary bonding portion 12 is a removable auxiliary bonding portion 12.

In the embodiment, the electronic device comprises an IC 3 or an FPC 2. The bonding portion 11 comprises an FPC bonding region 112 and an IC bonding region 113 (see FIG. 1a). The FPC bonding region 112 and the IC bonding region 113 are protrusive with respect to other regions of the base substrate 1. Pins of the IC 31 are bonded to the IC bonding region 113, and pins 21 of the FPC are bonded to the FPC bonding region 112.

The invention further provides a display device comprising the above-mentioned flexible substrate.

Furthermore, the invention also provides a method for bonding an electronic device onto a flexible substrate. Specifically, the method may comprise a step of bonding the electronic device onto a base substrate of the flexible substrate. Moreover, before the step of bonding the electronic device onto the base substrate of the flexible substrate, the method further comprises the following step of: forming an auxiliary bonding portion 12 disposed back to back with the bonding portion 11 and allowing the bonding portion 11 to completely fall into a region where the auxiliary bonding portion is provided 12 in the orthographic projection direction.

Specifically, the step of forming the auxiliary bonding portion 12 disposed back to back with the bonding portion 11 and allowing the bonding portion 11 to completely fall into the region where the auxiliary bonding portion is located 12 in the orthographic projection direction comprises: extending the base substrate towards an outer side of the bonding portion to dispose an extension portion with the area of the extension portion being larger than or equal to that of the bonding portion; bending the extension portion towards the back side of the bonding portion such that the extension portion forms the auxiliary bonding portion disposed back to back with the bonding portion. The above steps will be described with reference to FIG. 1a-1b.

As illustrated in FIG. 1a-1b, the base substrate 1 is first extended towards an outer side of the bonding portion 11 to dispose an extension portion 14, and a first bending line 101 (not shown in FIG. 1b) is disposed between the bonding portion 11 and the extension portion 14. The extension portion 14 and the bonding portion 11 are made of a same material. The extension portion 14 comprises a first extension portion 141, the area of the first extension portion 141 is larger than or equal to that of the bonding portion 11, and a thickness of the first extension portion 141 is equal to that of the bonding portion 11.

Next, the first extension portion 141 is bended along the first bending line 101 and disposed at the back side of the bonding portion 11, that is, the first extension portion 141 forms the first sub-bonding portion 121. In the embodiment, the first sub-bonding portion 121 is the auxiliary bonding portion 12.

In the configuration of the flexible substrate formed after the bending process (please see FIG. 2) according to the embodiment, although the first bending line 101 is not shown in FIG. 2, it is understandable that the first bending line 101 is disposed between the bonding portion 11 and the auxiliary bonding portion 12.

In the embodiment, the strength of the part of the flexible substrate that corresponds to the bonding portion 11 is improved during bonding by disposing the auxiliary bonding portion 12 at the back side of the part of the base substrate 1 that corresponds to the bonding portion 11. Next, the bonding process is performed and the pins 31 of an IC 3 are bonded to the IC bonding region 113 via ACF, and the pins 21 of an FPC 2 are bonded to the FPC bonding region 112 via ACF, as illustrated in FIG. 2. After the flexible display device is formed, the auxiliary bonding portion 12 is completely disposed at the back side of the display panel and will not influence the display effect of the display device in any way.

Embodiment 2

Figure 3A:
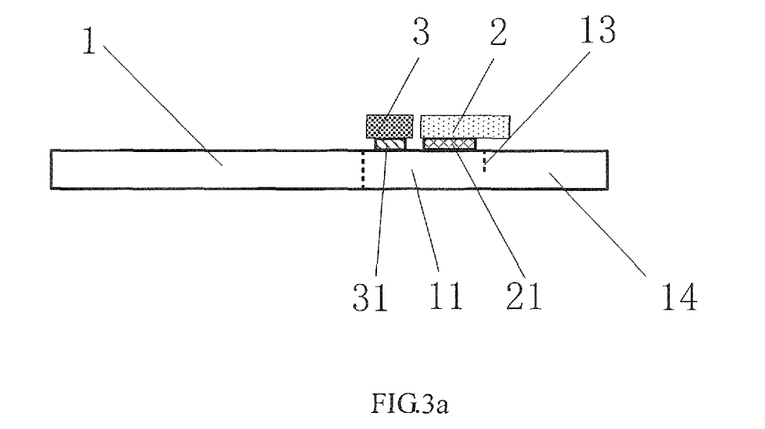
FIG. 3a schematically illustrates a front view of a flexible substrate before bending according to embodiment 2 of the invention, in which an extension portion is disposed at a side of a bonding portion of the flexible substrate.
Figure 3B:
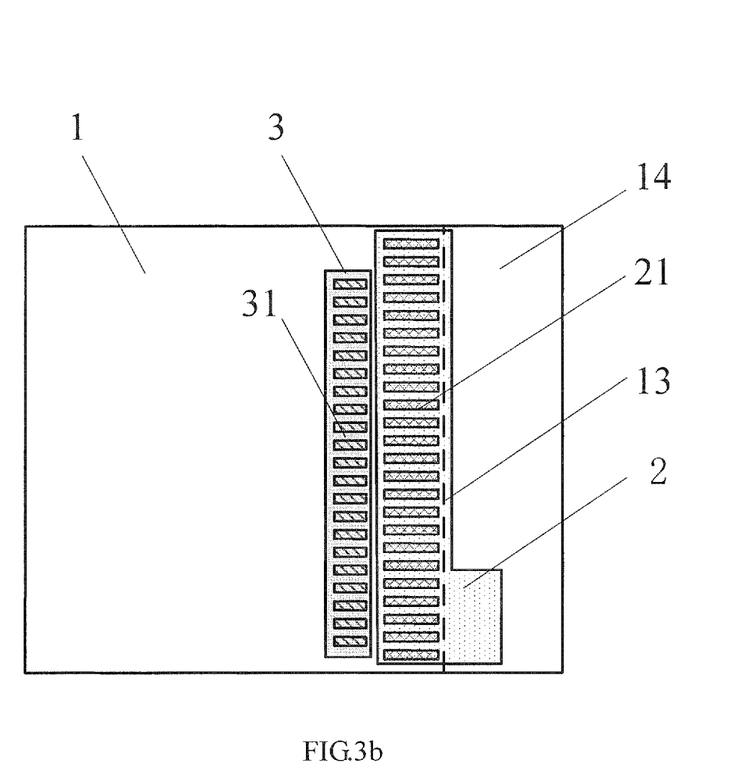
FIG. 3b schematically illustrates a top view of the flexible substrate before bending illustrated in FIG. 3a according to embodiment 2 of the invention.

As shown in FIGS. 3a and 3b, the present embodiment differs from Embodiment 1 in that an auxiliary structure 13 that facilitates folding, such as a groove or a plurality of through holes or blind holes along the thickness direction of the bonding portion 11, is further disposed at the position of the first bending line between the bonding portion 11 and the auxiliary bonding portion 12, in the flexible substrate of the present embodiment.

As illustrated in FIGS. 3a-3b, the auxiliary structure 13 may be a groove arranged along the thickness direction of the bonding portion 11 at a position on the base substrate 1 that corresponds to the first bending line, and a depth of the groove is smaller than the thickness of the bonding portion 11.

A plurality of through holes or blind holes arranged along the thickness direction of the bonding portion 11 may also be formed at a position on the base substrate 1 that corresponds to the first bending line. The provision of the through holes or blind holes makes it easier to fold the bonding portion 11 and the first sub-bonding portion 121 together. The through holes or blind holes may be arranged at a predetermined pitch. For example, the pitch between two adjacent through holes or blind holes is less than or equal to 3 mm.

Accordingly, before bonding the electronic device on the bonding portion of the base substrate of the flexible substrate, the procedure of disposing the auxiliary bonding portion 12 further comprises: extending the base substrate 1 towards an outer side of the bonding portion 11 to dispose an extension portion 14 with an area of the extension portion being larger than or equal to that of the bonding portion 11; bending the extension portion 14 towards the back side of the bonding portion 11 such that the extension portion 14 forms the auxiliary bonding portion 12 disposed back to back with the bonding portion 11.

In comparison with Embodiment 1, the embodiment further comprises: forming a groove along a thickness direction of the bonding portion 11 at a position on the base substrate 1 that corresponds to the first bending line, a depth of the groove being smaller than the thickness of the bonding portion 11; or forming a plurality of through holes or blind holes along a thickness direction of the bonding portion 11 at a position on the base substrate 1 that corresponds to the first bending line, a density of the through holes or the blind holes being configured for allowing the bonding portion 11 and the first sub-bonding portion 121 to be easily folded, so as to increase the production efficiency.

Other structures of the flexible substrate and the method for bonding the electronic devices of the embodiment are the same as Embodiment 1 and will not be elaborated here.

The invention further provides a display device comprising the above-mentioned flexible substrate.

In the flexible substrate according to the present embodiment, a groove or a plurality of through holes or blind holes are formed between the bonding portion and the auxiliary bonding portion (the first sub-bonding portion), which facilitates the bending of the bonding portion and the auxiliary bonding portion of the flexible substrate, thereby reducing the warp of the flexible substrate during the bending and guaranteeing the display quality of the display device.

Embodiment 3

The present embodiment differs from Embodiment 1 in that the auxiliary bonding portion 12 of the embodiment has several stacked layers.

Figure 5:
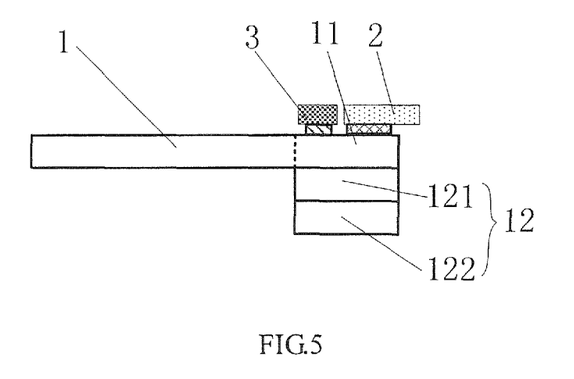
FIG. 5 schematically illustrates a front view of the flexible substrate after bending according to embodiment 3 of the invention, in which the extension portion of FIGS. 4a-4b is bended to the back side of the bonding portion to form an auxiliary bonding portion.

As illustrated in FIG. 5, the auxiliary bonding portion 12 comprises a first sub-bonding portion 121, and further comprises a second sub-bonding portion 122 having at least one stacked layer. A second bending line is disposed between the first sub-bonding portion 121 and the second sub-bonding portion 122, and the second sub-bonding portion 122 is disposed on the back side of the first sub-bonding portion 121 along the second bending line.

Herein, the area of the second sub-bonding portion 122 will not be limited. When the area of the second sub-bonding portion 122 is much larger than that of the first sub-bonding portion 121, the second sub-bonding portion 122 may be formed to have several stacked layers that are disposed sequentially further away from the first sub-bonding portion 121, and the area of each of the stacked layers will not be limited, with each layer having an equal area or a different area, as long as the stacked layers can function to enhance the first sub-bonding portion 121. In the present embodiment, as illustrated in FIG. 5, an area of each of the stacked layers in the second sub-bonding portions 122 is equal to that of the bonding portion 11 or that of the first sub-bonding layer 121, and the stacked layers are arranged back to back. Moreover, the second sub-bonding portion 122 is configured as having several stacked layers having equal areas to that of the first sub-bonding portion 121 and sequentially stacked at the back side of the first sub-bonding portion 121.

Accordingly, the step of forming the auxiliary bonding portion disposed back to back with the bonding portion and allowing the bonding portion to completely fall into a region where the auxiliary bonding portion is provided in the orthographic projection direction, before bonding the electronic device onto the base substrate of the above flexible substrate, further comprises the step of forming the second sub-bonding portion 122 at the back side of the first sub-bonding portion 121.

Figure 4A:
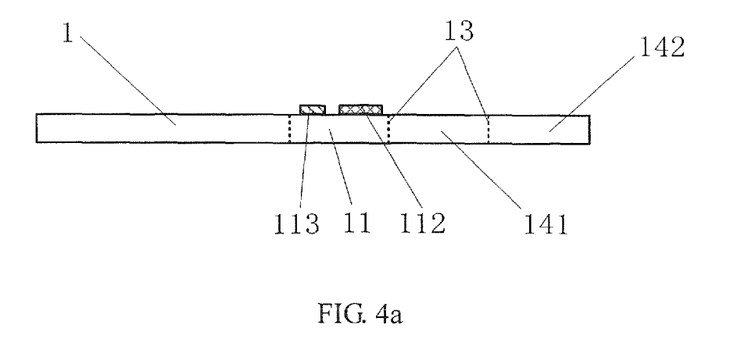
FIG. 4a schematically illustrates a front view of a flexible substrate before bending according to embodiment 3 of the invention, in which an extension portion is disposed at a side of a bonding portion of the flexible substrate.
Figure 4B:
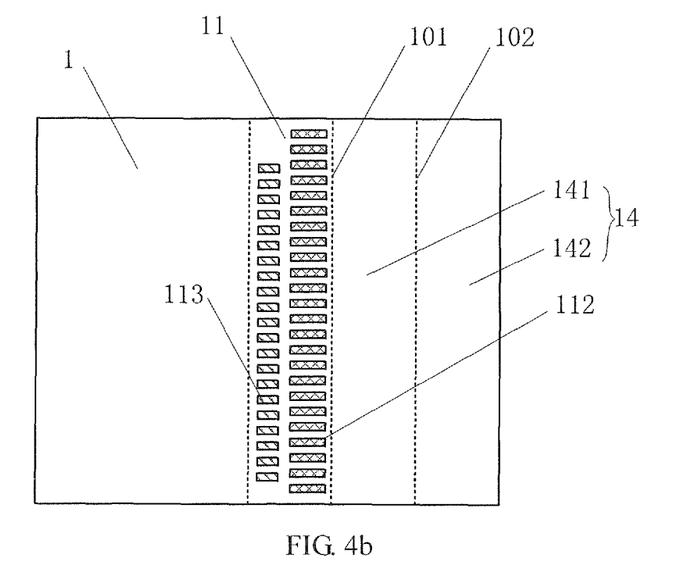
FIG. 4b schematically illustrates a top view of the flexible substrate before bending illustrated in FIG. 4b according to embodiment 3 of the invention.

Specifically, as illustrated in FIGS. 4a-4b, the extension portion 14 further has a second sub-extension portion 142, and a second bending line 102 is disposed between the first sub-extension portion 141 and the second sub-extension portion 142. The second sub-extension portion 142 is bended to be disposed at the back side of the first sub-bonding portion 121 along the second bending line 102, that is, the second sub-extension portion 142 forms the second sub-bonding portion 122.

In the configuration of the flexible substrate formed after the bending process (see FIG. 5) according to the present embodiment, although the second bending line 201 is not shown in FIG. 5, it is understandable that the second bending line 201 is disposed between the first sub-bonding portion 121 and the second sub-bonding portion 122.

Preferably, a groove may be formed along the thickness direction of the bonding portion 11 at a position of the second bending line between the first sub-bonding portion 121 and the second sub-bonding portion 122, and a depth of the groove is smaller than the thickness of the bonding portion 11. Or, a plurality of through holes or blind holes may be formed along the thickness direction of the bonding portion 11 at a position of the second bending line between the first sub-bonding portion 121 and the second sub-bonding portion 122 so that the second sub-bonding portion 122 and the first sub-bonding portion 121 can be easily folded together. The through holes or blind holes may be arranged at a predetermined pitch.

To facilitate the production, a thickness of any one of the stacked layers in the second sub-bonding portion 122 is equal to that of the bonding portion 11. Of course, the thickness of any one of the stacked layers in the second sub-bonding portion 122 can be designed as unequal to the thickness of the bonding portion 11 based on practical situations or special requirements.

In the present embodiment, because the second sub-bonding portion comprises stacked layers, the total thickness of the stacked layers is relatively large, and a support rigidity larger than that in Embodiments 1 and 2 can be provided, giving a better bonding effect for the electronic devices.

Other structures of the flexible substrate and the method for bonding the electronic devices of the embodiment are the same as Embodiment 1 and will not be elaborated here.

The present embodiment further provides a display device comprising the above-mentioned flexible substrate.

Embodiment 4

Figure 6A:
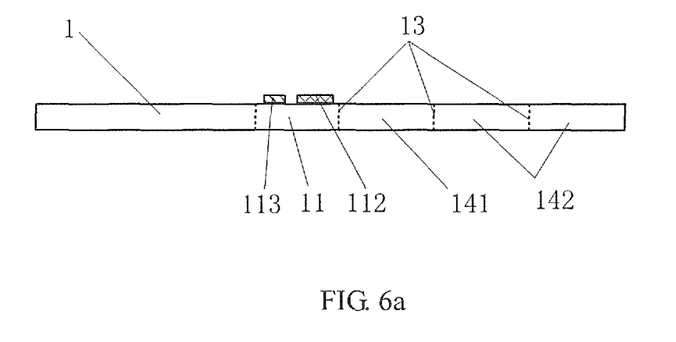
FIG. 6a schematically illustrates a front view of a flexible substrate before bending according to embodiment 4 of the invention, in which an extension portion is disposed at a side of a bonding portion of the flexible substrate.
Figure 6B:
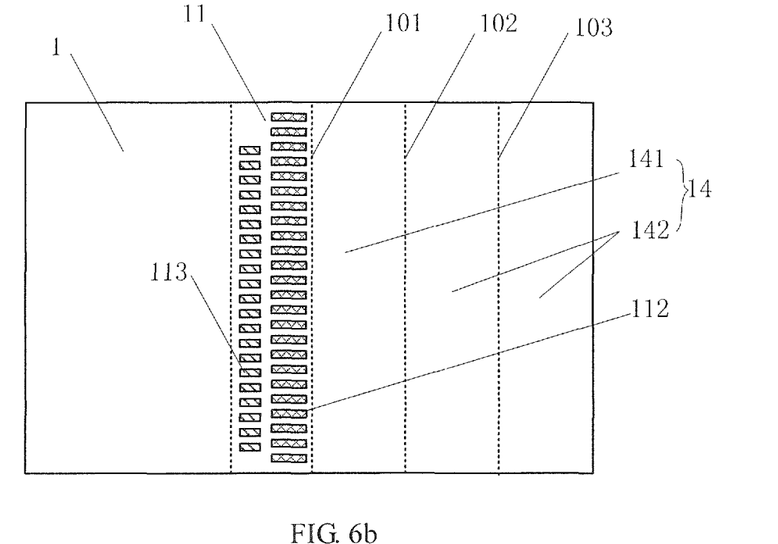
FIG. 6b schematically illustrates a top view of the flexible substrate before bending illustrated in FIG. 6a according to embodiment 4 of the invention.
Figure 7:
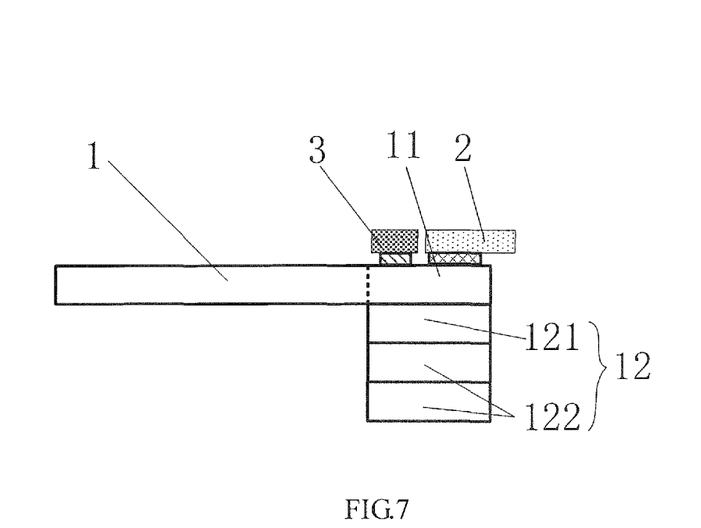
FIG. 7 schematically illustrates a front view of the flexible substrate after bending according to embodiment 4 of the invention, in which the extension portion of FIGS. 6a-6b is bended to the back side of the bonding portion to form an auxiliary bonding portion.

As illustrated in FIGS. 6a-6b and FIG. 7, the present embodiment differs from Embodiment 3 in that a third bending line 103 is disposed between adjacent stacked layers in the second sub-bonding portion 122 in the flexible substrate of the present embodiment. Moreover, an auxiliary structure 13 which facilitate folding is disposed at a position on the base substrate that corresponds to the third bending line 103 such that all the stacked layers in the second sub-bonding portion 122 can be more easily bended and the bonding between adjacent stacked layers is closer.

In the present embodiment, a third bending line 103 is disposed between adjacent stacked layers of the second sub-bonding portion 122, a groove along the thickness direction of the stacked layers in the second sub-bonding portion 122 is disposed at a position on the base substrate 1 that corresponds to the third bending line 103, and a depth of the groove is less than the thickness of a stacked layer in the second sub-bonding portion. Or, a plurality of through holes or blind holes along the thickness direction of the stacked layers in the second sub-bonding portion 122 is disposed at a position on the base substrate 1 that corresponds to the third bending line 103 such that adjacent stacked layers in the second sub-bonding portion 122 can be easily folded together. The through holes or blind holes may be arranged at a predetermined pitch.

Accordingly, the step of forming the auxiliary bonding portion disposed back to back with the bonding portion and allowing the bonding portion to completely fall into a region where the auxiliary bonding portion is provided in the orthographic projection direction, before bonding the electronic device onto the base substrate of the above flexible substrate, further comprises the step of forming the stacked layers in the second sub-bonding portion 122.

Specifically, the second sub-extension portion 142 is configured as having at least one stacked layer; a third bending line 103 is disposed between adjacent stacked layers in the second sub-extension portion 142. A groove along the thickness direction of the second extension portion 142 is disposed at a position of the second extension portion 142 that corresponds to the third bending line 103, and a depth of the groove is less than the thickness of the second extension portion 142. Or, a plurality of through holes or blind holes along the thickness direction of the second extension portion 142 is disposed at a position of the second extension portion 142 that corresponds to the third bending line 103 such that the bonding portion and the auxiliary bonding portion can be easily folded together. The through holes or blind holes may be arranged at a predetermined pitch.

Other structures of the flexible substrate and the method for bonding the electronic devices of the embodiment are the same as Embodiment 2 and will not be elaborated here.

The present embodiment further provides a display device comprising the above-mentioned flexible substrate.

In the flexible substrate according to the present embodiment, a groove or a plurality of through holes or blind holes are disposed between the individual stacked layers in the second sub-bonding portion, which facilitates the bending of the stacked layers in the auxiliary bonding portion, thereby reducing warp of the flexible substrate during bending.

Embodiment 5

The present embodiment differs from any of Embodiments 1 to 4 in that the auxiliary sub-bonding portion in the flexible substrate is removed after the bonding process for the electronic devices is completed.

The present embodiment further comprises removing the auxiliary bonding portion after bonding the electronic device onto the bonding portion of the base substrate of the flexible substrate.

Figure 8A:
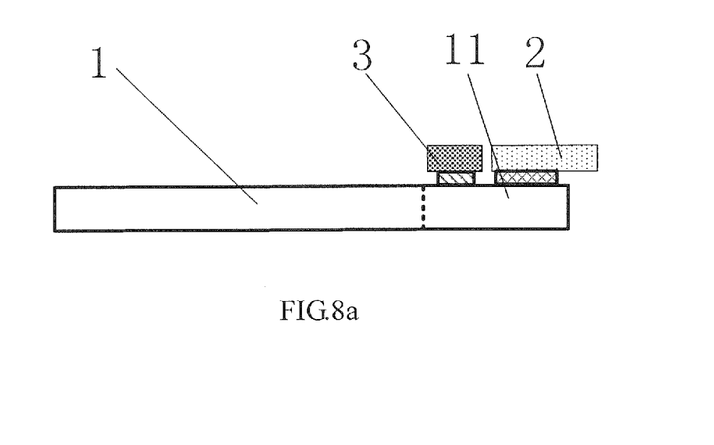
FIG. 8a schematically illustrates a front view of a flexible substrate in which the auxiliary bonding portion is cut and removed according to embodiment 5 of the invention.
Figure 8B:
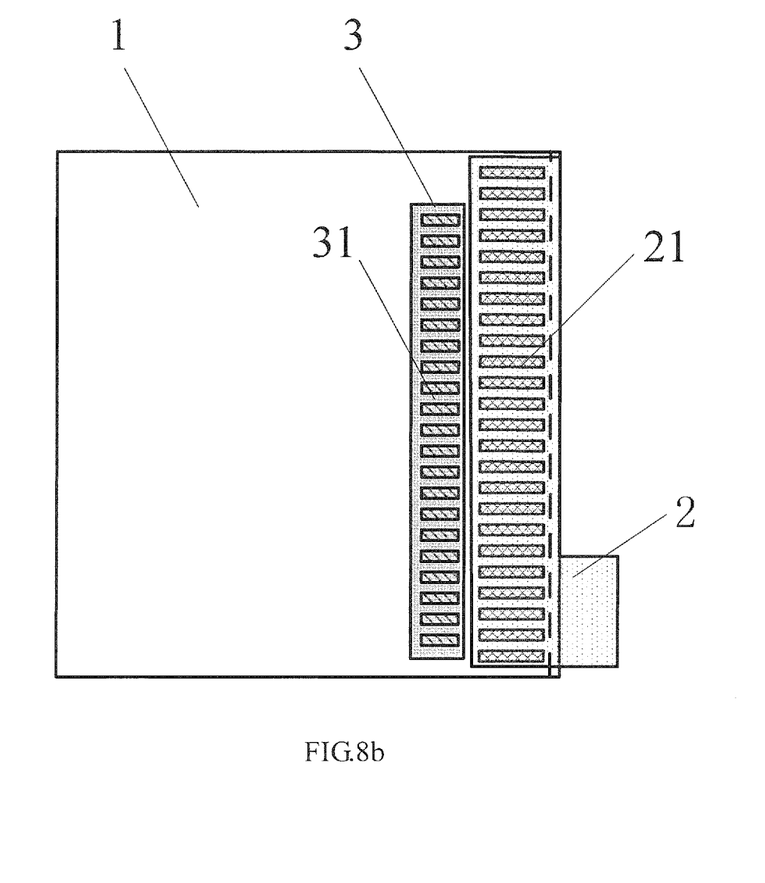
FIG. 8b schematically illustrates a top view of the flexible substrate in which the auxiliary bonding portion is cut and removed according to embodiment 5 of the invention.

The final configuration of the flexible substrate is illustrated in FIGS. 8a-8b.

That is, the auxiliary bonding portion may be selectively retained (Embodiments 1 to 4) or removed (the present embodiment) according to the practical situation, after the bonding process for the electronic devices is finished.

In the present embodiment, the auxiliary bonding portion is eventually removed, making it possible for the flexible display device to maintain a thin thickness, which can facilitate the production of thin and narrow flexible display devices. Moreover, with the flexible substrate of Embodiments 2 to 4, as grooves or plurality of through holes or blind holes are further formed along the thickness direction of the bonding portion or the auxiliary bonding portion at the position corresponding to the bending line of the auxiliary bonding portion or the bonding portion, it is easier to cut and remove the auxiliary boding portion in comparison with Embodiment 1.

In the flexible display device of the invention, the auxiliary bonding portion is disposed beside the bonding portion for bonding the electronic devices such as an IC or FPC onto the flexible substrate, enhances the strength of the bonding portion and improves the bonding alignment precision and contact property of the electronic device, and further improves the non-defect ratio of the flexible display device. Meanwhile, although the area of the base substrate of the flexible substrate is increased accordingly, the overall costs are still low because a thin flexible substrate is used.

It is understandable that the embodiments described above are illustrative only and not limitative to the scope of the disclosure. Those skilled in the art can make various modifications and variants without departing from the scopes and spirit of the disclosure. The modifications and variants are with the scopes of the invention as well.

The invention claimed is:

1. A flexible substrate for bonding an electronic device comprising a base substrate, wherein the base substrate comprising a non-bonding portion integrally formed with an edge of a bonding portion for bonding the electronic device thereon and an auxiliary bonding portion integrally formed with an opposing edge of the bonding portion, the auxiliary bonding portion and the bonding portion are disposed back to back, and the bonding portion completely falls into a region where the auxiliary bonding portion is provided in an orthrographic projection direction;

wherein a first bending line is disposed between the bonding portion and the auxiliary bonding portion, the auxiliary bonding portion comprises a first sub-bonding portion, an area of the first sub-bonding portion is larger than or equal to an area of the bonding portion, the first sub-bonding portion is bent and disposed onto the back side of the of the bonding portion along the first bending line; and wherein the auxiliary bonding portion further has a second sub-bonding portion having at least one stacked layer, a second bending line is disposed between the first sub-bonding portion and the second sub-bonding portion, and the second sub-bonding portion is bent and disposed onto the back side of the first sub-bonding portion along the second bending line, the auxiliary bonding portion is a removable auxiliary bonding portion and is removed after bonding the electronic device.

2. The flexible substrate of claim 1, wherein the auxiliary bonding portion and the bonding portion are made of the same material.

3. The flexible substrate of claim wherein a groove(s) along the thickness direction of the bonding portion is formed at a position(s) on the base substrate that corresponds to the first bending line and/or the second bending line, a depth of the groove(s) is less than the thickness of the bonding portion; or a plurality of through holes or band holes along the thickness direction of the bonding portion are disposed at a position(s) on the base substrate that corresponds to the first bending line and/or the second bending lines.

4. The flexible substrate of claim 1, wherein a third bending line is disposed between adjacent stacked layers in the second sub-bonding portion, a groove along the thickness direction of the stacked layers in the second sub-bonding portion is disposed at a position on the base substrate that corresponds to the third bending line, and a depth of the groove is less than a thickness of a stacked layer in the second sub-bonding portion; or a plurality of through holes or blind holes along the thickness direction of the stacked layers in the second sub-bonding portion is disposed at a position on the base substrate that corresponds to the third bending line.

5. The flexible substrate of claim 3, wherein a third bending line is disposed between adjacent stacked layers in the second sub-bonding portion, a groove along the thickness direction of the stacked layers in the second sub-bonding portion is disposed at a position on the base substrate that corresponds to the third bending line, and a depth of the groove is less than a thickness of a stacked layer in the second sub-bonding portion; or a plurality of through holes or blind holes along the thickness direction of the stacked layers in the second sub-bonding portion is disposed at a position on the base substrate that corresponds to the third bending line.

6. A display device comprising the flexible substrate of claim 1.

7. A method for bonding an electronic device onto a flexible substrate, comprising a step of bonding the electronic device onto a base substrate of the flexible substrate, wherein the base substrate comprises a non-bonding portion integrally formed with an edge of a bonding portion for bonding the electronic device thereon, wherein the method further comprises the following step before the step of bonding the electronic device onto the base substrate of the flexible substrate:

integrally forming an auxiliary bonding portion disposed back to back with the bonding portion allowing the bonding portion to completely fall into a region where the auxiliary bonding portion is provided in the orthographic projection direction, wherein forming the auxiliary bonding portion comprises:

extending a base substrate from an opposing edge of the bonding portion to dispose an extension portion with an area of the extension portion being larger than or equal to that of the bonding portion;

bending the extension portion towards a back side of the bonding portion such that the extension portion forms the auxiliary bonding portion disposed back to back with the bonding portion;

wherein a first bending line is disposed between the bonding portion and the extension portion, the extension portion has a first sub-extension portion with an area larger than or equal to an area of the bonding portion, the first sub-extension portion is bent and disposed onto the back side of the of the bonding portion along the first bending line to form a first sub-bonding portion;

wherein the extension portion further comprises a second sub-extension portion having at least one stacked layer, a second bending line is disposed between the first sub-extension portion and the second sub-extension portion, and the second sub-extension portion is bent and disposed onto the back side of the first sub-extension portion along the second bending line to form a second sub-bonding portion; and removing the auxiliary bonding portion after bonding the electronic device onto the base substrate of the flexible substrate.

8. The method of claim 7, wherein the extension portion and the bonding portion are made of a same material.

9. The method of claim 8, further comprises forming a groove along a thickness direction of the bonding portion at a position on the base substrate that corresponds to the first bending line, and a depth of the groove is smaller than the thickness of the bonding portion; or forming a plurality of through holes or blind holes along a thickness direction of the bonding portion at a position on the base substrate that corresponds to the first bending line.

10. The method of claim 8, further comprises a third bending line is disposed between adjacent stacked layers in the second sub-extension portion, a groove(s) along the thickness direction of the stacked layers in the second sub-bonding portion is disposed at a position(s) of the extension portion that corresponds to the second and/or third bending lines, a depth of the groove(s) less than the thickness of the extension portion; or a plurality of through holes or blind holes along thickness direction of the stacked layers in the extension portion is disposed at a position of the extension portion that corresponds to the second and/or third bending lines.

* * * * *